(12) United States Patent
Dunlap

(10) Patent No.: US 6,927,097 B2
(45) Date of Patent: Aug. 9, 2005

(54) PACKAGE WITH PRE-APPLIED UNDERFILL AND ASSOCIATED METHODS

(75) Inventor: Stewart Dunlap, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 10/401,377

(22) Filed: Mar. 27, 2003

(65) Prior Publication Data

US 2004/0188131 A1 Sep. 30, 2004

(51) Int. Cl.[7] .......................... H01L 21/44; H01L 23/48
(52) U.S. Cl. ...................... 438/118; 438/108; 438/119; 257/782; 257/783
(58) Field of Search ................................ 438/107, 108, 438/109, 118, 119; 257/686, 778, 782, 783; 174/52.1, 52.2, 52.3, 52.4

(56) References Cited

U.S. PATENT DOCUMENTS 5,535,101 A * 7/1996 Miles et al. ................ 257/686
6,300,686 B1 * 10/2001 Hirano et al. ............... 257/783
2002/0162679 A1 * 11/2002 Hannan et al. ............. 174/52.4

OTHER PUBLICATIONS

Chang, Benjamin, et al., "CARIVERSE Resin: A Thermally Reversible Network Polymer for Electronic Applications", *49th Electronic Components & Technology Conference*, (Jun. 1999), 49–55.

* cited by examiner

Primary Examiner—Kevin M. Picardat
(74) Attorney, Agent, or Firm—Schwegman, Lundberg, Woessner & Kluth, P.A.

(57) ABSTRACT

An underfill material is applied to an electronic component, such as a die, integrated circuit (IC) package, or printed circuit board, prior to mounting of the component upon another packaging element. In an embodiment, the component may be a singulated IC package. Strips of underfill material may be separated from a supply reel and applied to the edges of the IC package. Trays may convey the components to and from automated underfill attach equipment. Assembly methods, as well as application of the package to an electronic assembly and to an electronic system, are also described.

35 Claims, 11 Drawing Sheets

US 6,927,097 B2

PACKAGE WITH PRE-APPLIED UNDERFILL AND ASSOCIATED METHODS

TECHNICAL FIELD

The inventive subject matter relates generally to electronics packaging and, more particularly, to an electronics package with pre-applied underfill, and to manufacturing methods related thereto.

BACKGROUND INFORMATION

An integrated circuit ("IC") die may be assembled into an IC package by physically and electrically coupling it to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, computer with wireless network, etc.), computer-related peripherals (e.g., printer, scanner, monitor, wireless network card, etc.), entertainment devices (e.g., television, radio, stereo, tape and compact disc players, video cassette recorder, camcorder, digital camera, MP3 (Motion Picture Experts Group, Audio Layer 3) player, etc.), and the like.

An IC die may comprise one or more active and/or passive circuits. At least one surface of the die may comprise a number of pads or contacts to couple the die functionally to another element, such as an IC substrate. Two or more die may be stacked in a single package.

An IC substrate may comprise a number of layers. Some layers may comprise organic or ceramic dielectric material. Some layers may comprise conductors, such as traces, ground planes, and vias. An IC substrate may include an electronic component mounted on a surface of the substrate. The electronic component may be functionally connected to other elements of an electronic system through a hierarchy of conductors that include substrate traces, ground planes, and vias. The conductors may carry signals that are transmitted among the electronic components, such as IC's, of the system. An IC substrate may have a relatively large number of input/output ("I/O") terminals (also called "lands"), as well as a large number of power and ground terminals or lands, on a surface of the IC substrate.

In the field of electronics, it is known to apply a material, commonly referred to as "underfill", around and over the electrical connections between various components. One purpose of underfill is to increase adhesion between components that are electrically connected (e.g. via solder). Underfill is also used to absorb mechanical shock forces between internal components when an electronic system, such as a cellular telephone or hand-held computer, is inadvertently dropped. Without underfill, the electrical connections between components may be broken or disconnected. Another purpose of underfill is to provide a sealed environment to inhibit the intrusion of water or other contaminants. In addition, underfill may be used to decrease potentially harmful flexing forces on a component, such as a die mounted on a package substrate.

It is known to apply underfill subsequent to mounting an electronic component on a packaging element. For example, purchasers of IC's may apply underfill after they mount IC's on PCB's in the process of manufacturing electronic systems. Such purchasers buy the underfill and apply it as part of manufacturing operations. Such underfill may take the form of an epoxy that is applied after reflow and that may be cured in a subsequent heating operation after reflow.

DETAILED DESCRIPTION

In the following detailed description of embodiments of the inventive subject matter, reference is made to the accompanying drawings that form a part hereof, and in which is shown by way of illustration specific preferred embodiments in which the inventive subject matter may be practiced. These embodiments are described in sufficient detail to enable those skilled in the art to practice the inventive subject matter, and it is to be understood that other embodiments may be utilized and that structural, mechanical, compositional, electrical, and procedural changes may be made without departing from the spirit and scope of the inventive subject matter. The following detailed description is, therefore, not to be taken in a limiting sense, and the scope of embodiments of the inventive subject matter is defined only by the appended claims. Such embodiments of the inventive subject matter may be referred to, individually and/or collectively, herein by the term "invention" merely for convenience and without intending to voluntarily limit the scope of this application to any single invention or inventive concept if more than one is in fact disclosed.

The inventive subject matter provides techniques to apply underfill to an electronic device or component, such as a die, integrated circuit (IC) package, printed circuit board, or the like, prior to mounting of the component upon another packaging element. In an embodiment, the component may be a singulated IC package. Pieces of underfill material may be separated from a supply reel and applied to the edges of the IC package. Trays may convey the components to and from automated underfill attach equipment. Assembly methods, as well as application of the package to an electronic assembly and to an electronic system, are also described. Pre-applying underfill to electronic components before shipping them to customers may save the customers time and manufacturing expenses, because they may thereby avoid having to purchase and apply underfill when they mount the components on other packaging elements.

Figure 1:
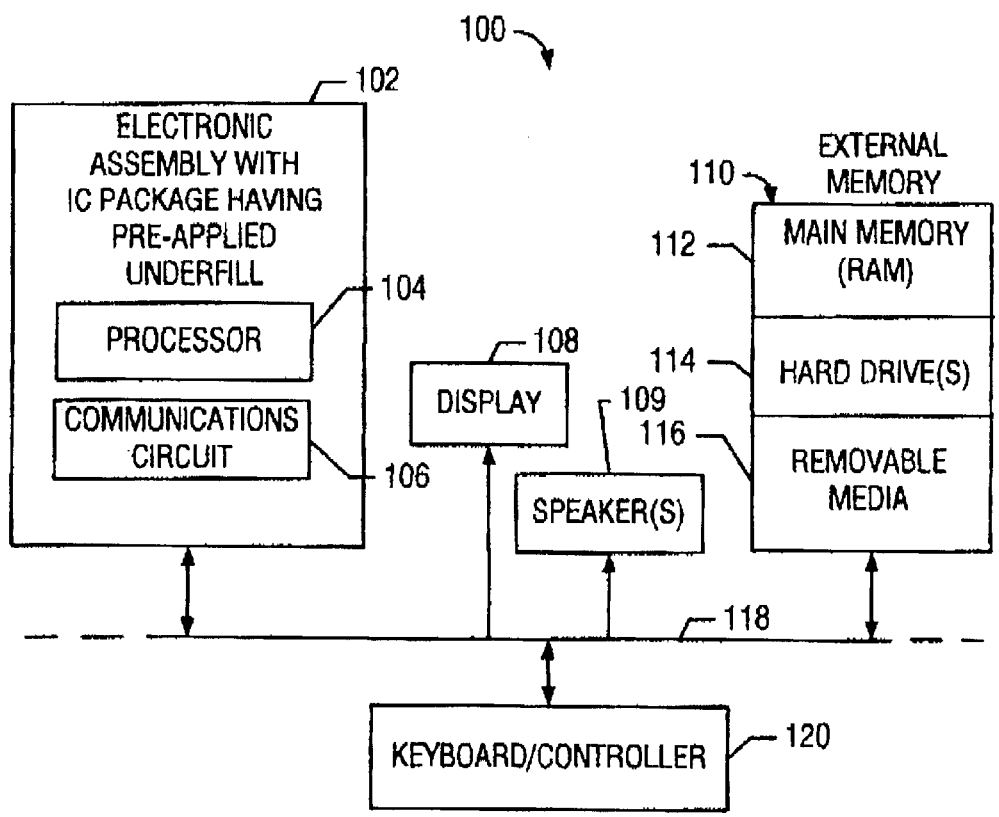
FIG. 1 is a block diagram of an electronic system incorporating at least one electronic assembly with an IC package having pre-applied underfill, in accordance with an embodiment of the inventive subject matter.

FIG. 1 is a block diagram of an electronic system 100 incorporating at least one electronic assembly 102 with an IC package having pre-applied underfill, in accordance with an embodiment of the inventive subject matter. Electronic system 100 is merely one example of an electronic system in which the inventive subject matter may be used. In this example, electronic system 100 comprises a data processing system that includes a system bus 118 to couple various components of the system. System bus 118 provides communications links among various components of the electronic system 100 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 102 is coupled to system bus 118. Electronic assembly 102 may include any circuit or combination of circuits. In an embodiment, electronic assembly 102 includes a processor 104 which may be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that may be included in electronic assembly 102 are a custom circuit, an application-specific integrated circuit (ASIC), or the like, such as, for example, one or more circuits (such as a communications circuit 106) for use in wireless devices like cellular telephones, pagers, portable computers, personal digital assistants, two-way radios, and similar electronic systems. The IC may perform any other type of function.

Electronic system 100 may also include an external memory 110, which in turn may include one or more memory elements suitable to the particular application, such as a main memory 112 in the form of random access memory (RAM), one or more hard drives 114, and/or one or more drives that handle removable media 116 such as floppy diskettes, compact disks (CDs), digital video disks (DVD), and the like.

Electronic system 100 may also include a display device 108, one or more speakers 109, and a keyboard and/or controller 120, which may include a mouse, trackball, game controller, voice-recognition device, or any other device that may permit a system user to input information into and receive information from the electronic system 100.

Figure 2:
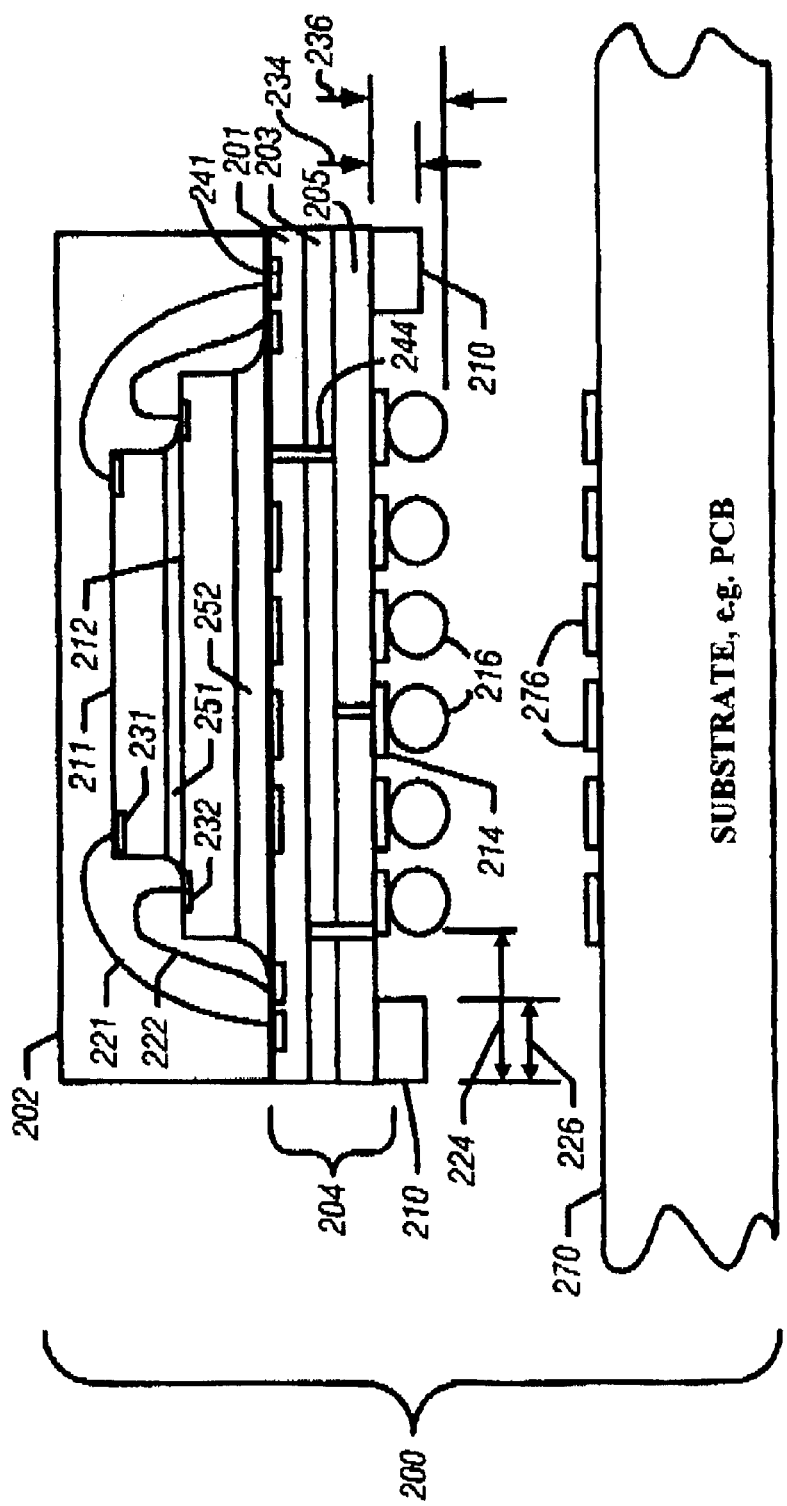
FIG. 2 illustrates a side representation of an electronic assembly comprising an IC package having a pre-applied underfill, prior to reflow, in accordance with an embodiment of the inventive subject matter.

FIG. 2 illustrates a side representation of an electronic assembly 200 comprising an IC package 202 having a pre-applied underfill 210, prior to reflow, in accordance with an embodiment of the inventive subject matter.

In the example shown in FIG. 2, IC package 202 comprises a stack of two dice 211 and 212 (e.g. flash memory IC's) mounted on a package substrate 204. IC package 202 may be mounted on another packaging element, such as substrate 270. Substrate 270 may comprise a PCB, for example.

The concepts of the inventive subject matter may be applied to any type of IC package. Although structural details of the particular IC package 202 illustrated in FIG. 2 may only be of secondary interest, they will now be briefly described. Die 212 may be mounted to the upper surface of package substrate 204. A plurality of conductors 222 may couple circuit nodes 232 (e.g. bonding terminals) on an active surface of die 212 to corresponding ones of terminals 241 on the upper surface of package substrate 204. Die 211 may be mounted upon die 212, and a plurality of conductors 221 may couple circuit nodes 231 on an active surface of die 211 to corresponding ones of terminals 241 on the upper surface of package substrate 204.

An adhesive or underfill 251 may be present between die 211 and 212, and an underfill 252 may be present between die 212 and the upper surface of package substrate 204. The underfills 251 and 252 may be of the type described elsewhere herein, or they may be conventionally applied underfills.

Structural details of package substrate 204 will now be briefly described. Package substrate 204 may comprise one or more layers. In the example shown in FIG. 2, package substrate 204 comprises three layers 201, 203, and 205. Package substrate 204 may also comprise a number of conductors, such as traces (not shown), ground planes (not shown), and vias 244 of any type. The conductors may be for signals, for power, and for ground. Various conductors may be formed in one or more layers within or between layers 201, 203, and 205. Package substrate 204 may include a plurality of terminals 241 on its upper surface. In addition, package substrate 204 may include a plurality of pads 214 on its lower surface.

Structural details of substrate 270 will now be briefly described. Substrate 270 may be any type of circuit board, such as a motherboard, a mezzanine board, or the like. Substrate 270 may be a one-layer board or a multi-layer board. Substrate 270 may comprise a plurality of lands 276 on an upper surface, and it may include additional lands on its opposite surface for mating with additional packaging structure (not shown).

IC package 202 may be coupled to substrate 270 through pads 214 on the bottom surface of package substrate 204, through solder balls or bumps 216, and through corresponding lands 276 on the upper surface of substrate 270. Pads 214, solder balls 216, and lands 276 may be part of a ball grid array ("BGA") structure. The structure, such as solder balls 216, of IC package 202 used to couple IC package 202 to an additional packaging element, such as substrate 270, may be referred to herein as an "interconnect".

The pre-applied underfill 210 will now be discussed. In the example shown in FIG. 2, underfill 210 has been pre-applied prior to IC package 202 being coupled to substrate 270. The thickness 234 of underfill 210 may be less than the thickness 236 of the interconnects, which in this example comprise solder balls 216. This is so that underfill 210 will not touch or adhere to the upper surface of substrate 270 until solder balls 216 undergo reflow. An IC package 202 with pre-applied underfill 210 may thus be oriented with respect to substrate 270 with minimal concern that underfill 210 will inadvertently stick to substrate 270. In general, the thickness 234 of underfill 210 may be selected to be less than the combined thicknesses of pads 214, of the interconnect, and of lands 276, if one desires that underfill 210 not contact substrate 270 prior to reflow. As will be discussed below, it is not essential that the thickness 234 of underfill 210 be so constrained, and in some embodiments the thickness 234 of underfill 210 could extend further out from the bottom surface of IC package 204, so that underfill 210 may touch the upper surface of substrate 270 prior to reflow.

In the embodiment shown in FIG. 2, the width 226 of underfill 210 may be approximately half the width 224 between the edge of package substrate 204 and the interconnects, which in this example comprise solder balls 216. In other embodiments, the width 226 may be of any suitable dimension, e.g. narrower or wider than that illustrated in FIG. 2.

Underfill 210 may comprise any suitable material.

In an embodiment, underfill 210 may comprise a thermally reversible material.

"Thermally reversible", as used herein, means that the material may be repeatedly heated and cooled without substantially altering the inherent physical or chemical properties of the material, except that it becomes relatively less viscous as it is heated, and it becomes relatively more viscous as it is cooled.

Using a thermally reversible material in underfill 210 may enable the electronic assembly 200 to be reworked, by heating underfill 210 suitably for it to become less viscous again. The ability to rework electronic assemblies, such as electronic assembly 200, is an advantage, because it may decrease manufacturing costs.

In an embodiment, underfill 210 comprises a thermally reversible network polymer. A known example of a thermally reversible network polymer is Cariverse™ resin, which is commercially available from Resolution Performance Products, Houston, Tex., whose URL is currently www-resins-com (to avoid inadvertent hyperlinks, the periods in the preceding URLs have been replaced by hyphens.)

A thermally reversible network polymer, such as Cariverse™ resin, contains thermally reversible covalent crosslinks. At room temperature, the material is relatively solid and may have adhesion, CTE (coefficient of thermal expansion), dielectric, mechanical, and other properties similar to an epoxy thermoset underfill. At higher temperature, these crosslinks dissociate to yield a low-viscosity substance, and when it is subsequently cooled the substance readily polymerizes to regenerate the original solid network polymer.

Although, in an embodiment, a thermally reversible network polymer is used, in other embodiments a non-thermally reversible polymeric adhesive may be used, for example, if reworkability is not required.

As an alternative to a polymeric adhesive, underfill 210 may comprise a thermoset plastic, an unlinkable epoxy, or other suitable material having properties similar to or identical to those described herein.

The flow characteristics of underfill 210 may be selected such that underfill 210 is not sticky (or relatively unsticky) at room temperature. Thus it may be used with known IC manufacturing equipment, such as pick-and-place equipment.

In an embodiment wherein underfill 210 comprises Cariverse™ resin, at temperatures in the range of 100–130 degrees Centigrade("C"), underfill 210 tacks in place, and pieces of underfill 210 may be tacked to IC package 202, for example, by pick-and-place equipment. At approximately 125 C, underfill 210 softens, and at approximately 160 C, it becomes sticky but does not substantially change shape.

At a reflow temperature within the range of approximately 200–220 C, underfill 210 becomes substantially less viscous. At such temperature, underfill 210 flows sufficiently to contact the upper surface of substrate 270, while remaining in contact with the lower surface of package substrate 204 of IC package 202.

In some embodiments, underfill 210 may also expand linearly in a direction parallel to the edge of package substrate 204, so that any gaps (refer to the embodiments shown in FIGS. 6–7) between separate pieces of underfill 210 may contact one another and become substantially coupled to one another. In other embodiments, underfill 210 does not expand linearly, and gaps remain between separate pieces of underfill 210.

Following reflow, underfill 210 becomes substantially solid again at room temperature.

Figure 3:
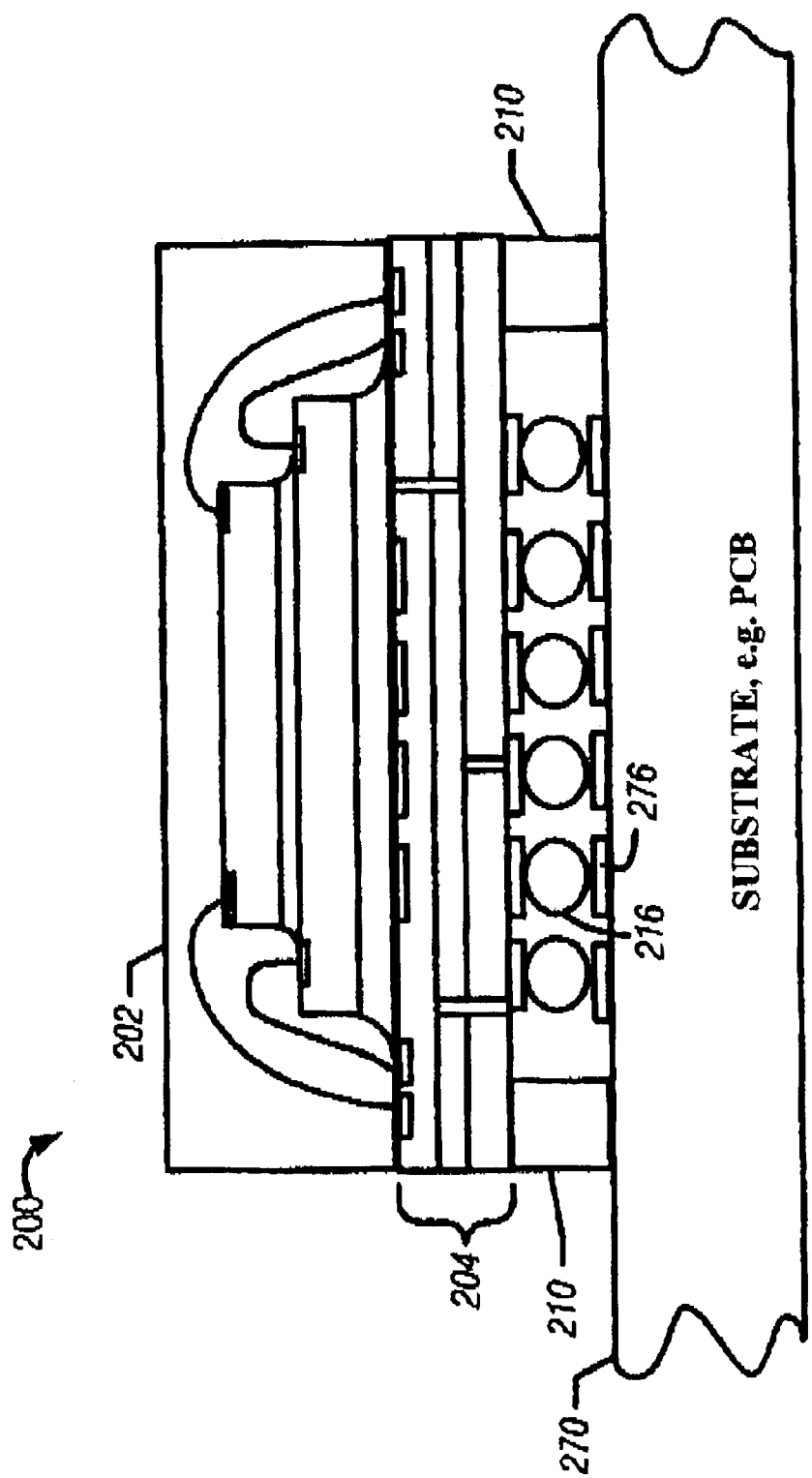
FIG. 3 illustrates a side representation of an electronic assembly comprising an IC package having a pre-applied underfill, following reflow, in accordance with the embodiment of the inventive subject matter illustrated in FIG. 2.

FIG. 3 illustrates a side representation of an electronic assembly 200 comprising an IC package 202 having a pre-applied underfill 210, following reflow, in accordance with the embodiment of the inventive subject matter illustrated in FIG. 2.

At a suitable reflow temperature, solder balls 216 melt and adhere to lands 276 on substrate 270. In addition, underfill 210 softens. Depending upon the type of underfill material, underfill 210 may flow. At a sufficiently elevated temperature, underfill 210 softens and/or flows sufficiently to contact the upper surface of substrate 270, while remaining in contact with the lower surface of package substrate 204 of IC package 202.

When electronic assembly 200 is subsequently cooled, IC package 202 is mechanically and electrically coupled to substrate 270, and underfill 210 becomes relatively solid and adheres to both the lower surface of package substrate 204 and to the upper surface of substrate 270. Underfill 210 may thus form a resilient, protective connection between IC package 202 and substrate 270.

Subsequent to reflow, the property of the underfill 210 being thermally reversible may allow the underfill 210 to be adjusted and/or removed, for example to examine, replace, and/or repair elements of the package.

Figure 4:
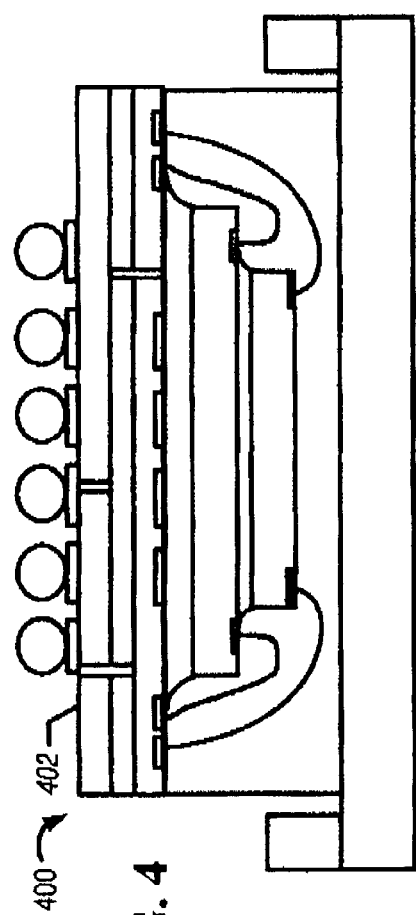
FIG. 4 illustrates a side representation of an IC package in a tray prior to the application of underfill, in accordance with an embodiment of the inventive subject matter.

FIG. 4 illustrates a side representation of an IC package 400 in a tray 404 prior to the application of underfill, in accordance with an embodiment of the inventive subject matter. In this figure, the IC package 400 is shown inverted relative to the position of IC package 202 that is. illustrated in FIGS. 2–3. IC package 400 is within a tray 404. IC package 400 may be similar to or identical to IC package 202 illustrated in FIGS. 2–3, or IC package 400 may be different from IC package 202.

Within a production environment, such as a high volume manufacturing environment, trays may be used to convey components, such as dice, IC packages, circuit boards, and the like to and from automated underfill attach equipment.

Figure 5:
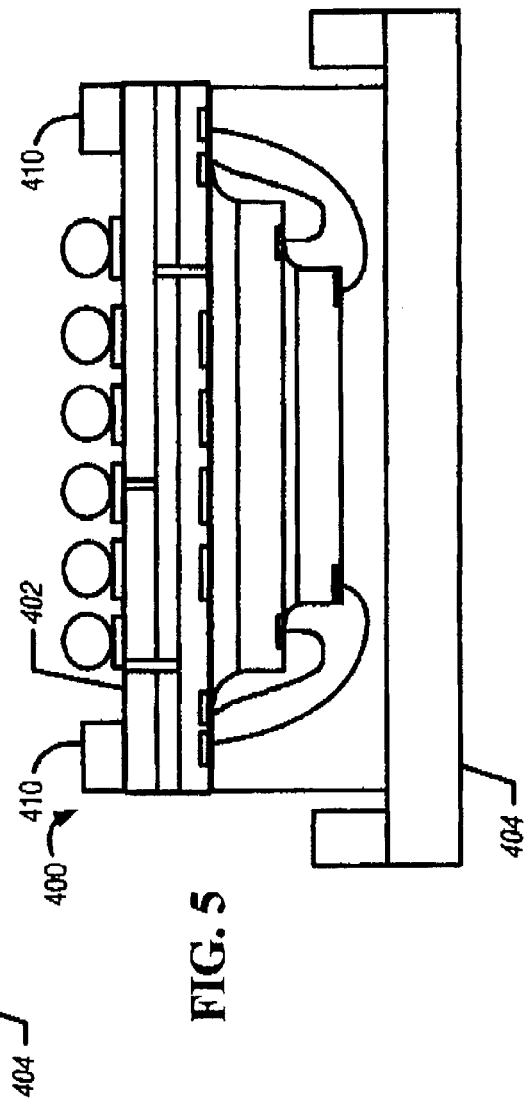
FIG. 5 illustrates a side representation of an IC package in a tray after the application of underfill, in accordance with the embodiment of the inventive subject matter illustrated in FIG. 4.

FIG. 5 illustrates a side representation of an IC package 400 in a tray 404 after the application of underfill 410, in accordance with the embodiment of the inventive subject matter illustrated in FIG. 4. Underfill 410 has been applied along or near the outer edge of IC package 402.

As will be discussed further below, the upper surface of IC package 402 may be heated (e.g. to within a range of approximately 100–130 C in an embodiment for a particular type of underfill) before underfill 410 is applied, in order to increase the adhesion between underfill 410 and IC package 402.

Underfill 410 may be applied in any suitable configuration, including those shown in FIGS. 6, 7, and 8, which are discussed in greater detail below.

Figure 6:
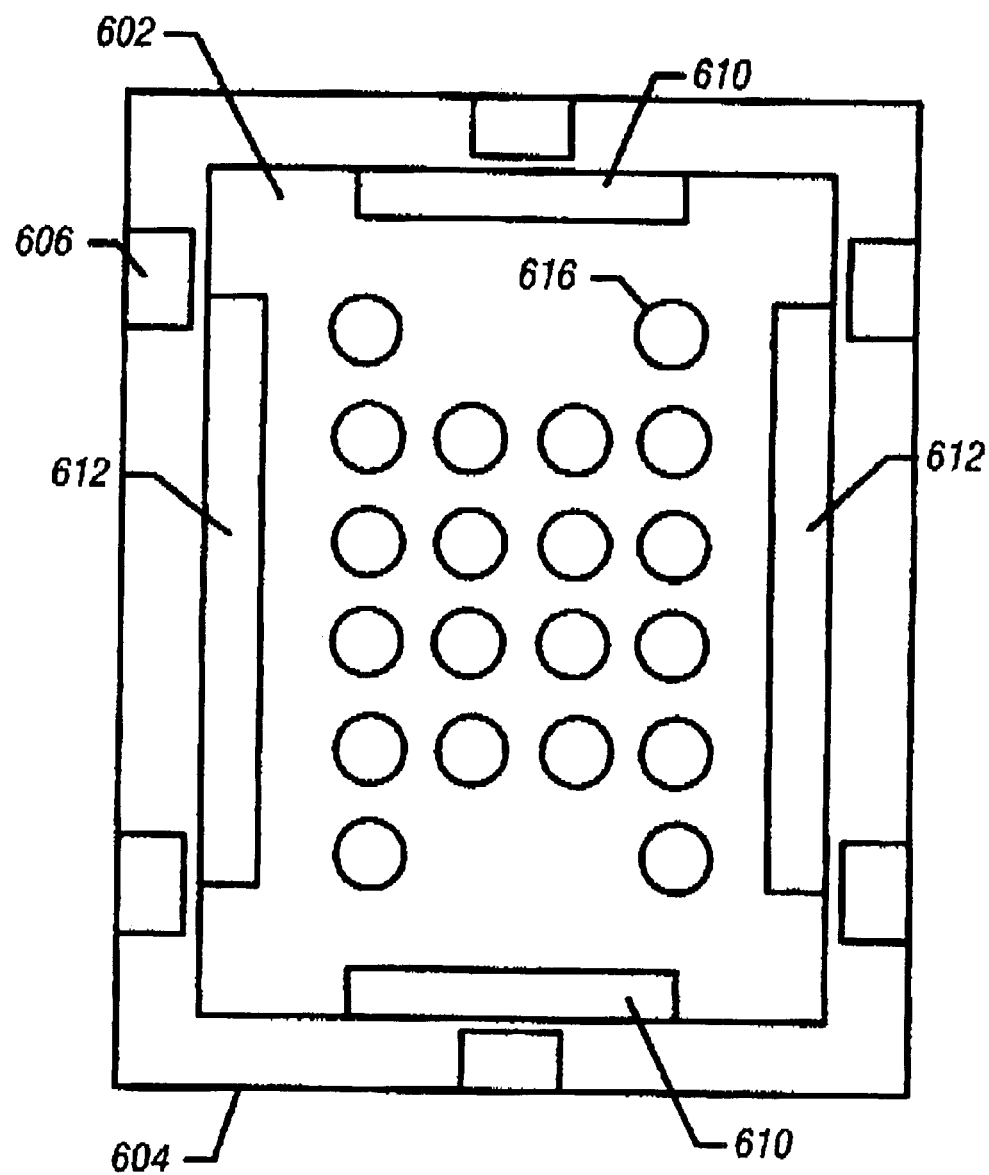
FIG. 6 illustrates a top representation of an IC package in a tray after the application of underfill elements, in accordance with an embodiment of the inventive subject matter.

FIG. 6 illustrates a top representation of an IC package 602 in a tray 604 after the application of underfill elements 610 and 612, in accordance with an embodiment of the inventive subject matter.

IC package 602, which may be similar to, identical to, or different from IC package 402 illustrated in FIGS. 4–5, is shown with its interconnects (e.g. solder balls 616) facing up. IC package 602 lies within tray 604. Tray 604 may have elevated detents or barriers 606 to retain IC package 602 within tray 604.

As seen in the example shown in FIG. 6, a pair of underfill elements 610 are located along or near the edges of a first pair of opposing sides (e.g. the width dimension) of IC package 602, while another pair of underfill elements 612 are located along or near the edges of a second pair of opposing sides (e.g. the length dimension) of IC package 602. In this example, underfill elements 610 and 612 are not placed at corners of IC package 602, in order to avoid underfill inadvertently contacting other parts during fabrication operations.

In this embodiment, the underfill elements 610 and 612 are applied as individual pieces, strips, or elements. The individual pieces of underfill material may be separated from a supply reel, e.g. by cutting or punching. The individual pieces may be picked up and placed at the edges of IC package 602 by any suitable mechanism, including a pick-and-place machine having a vacuum-head.

Although individual underfill elements 610 and 612 are illustrated in this example as having a particular length, relative to their respective sides, they may have a different length in other embodiments. Also, in other embodiments, underfill elements 610 may not necessarily be of equal length; similarly, underfill elements 612 need not necessarily be of equal length. Underfill elements 610 and 612 could alternatively all be of equal length; or they could all have different lengths.

Although underfill elements 610 and 612 are illustrated in this example as being positioned along the outside edge of IC package 602, in other embodiments they could be positioned at any suitable location between the solder balls 616 and the outside edge of IC package 602.

Figure 7:
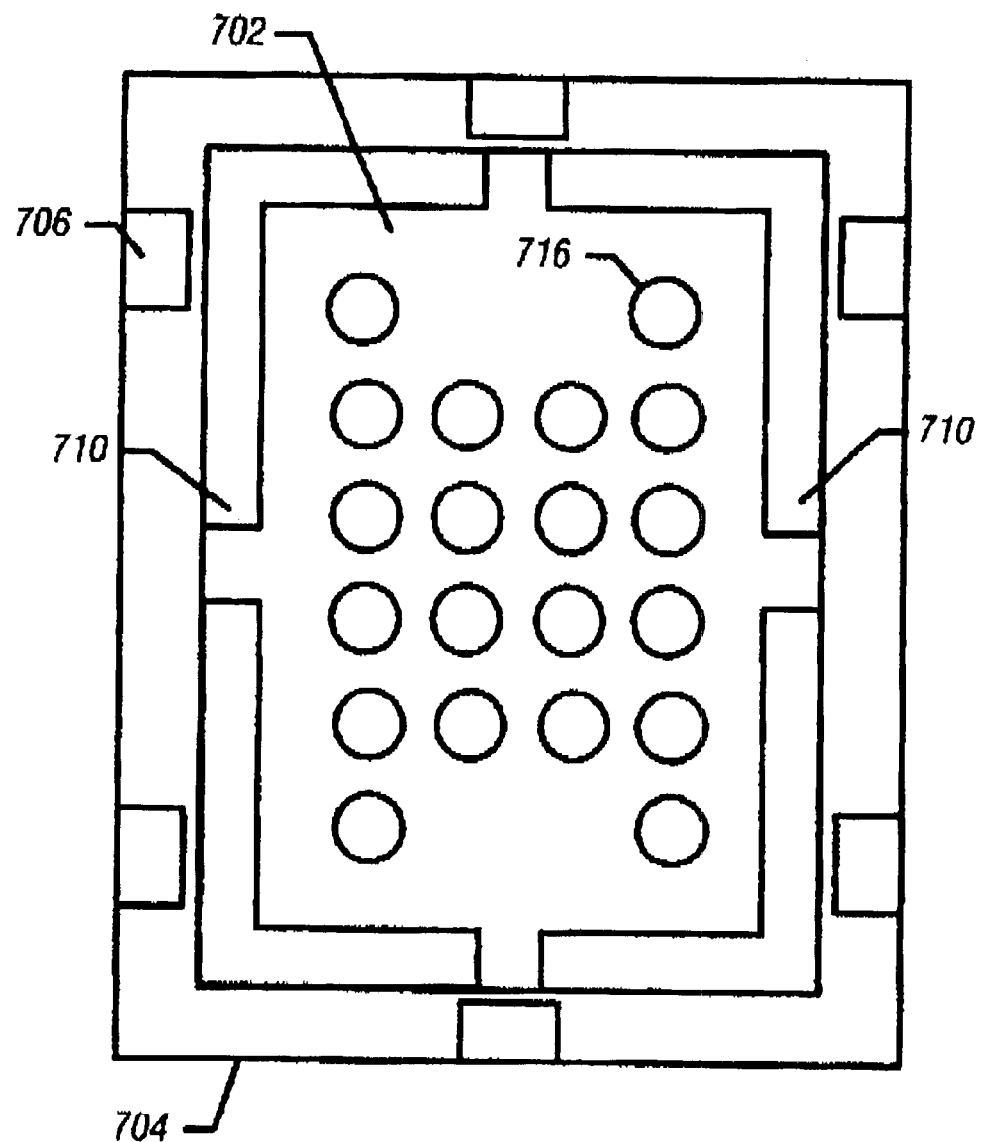
FIG. 7 illustrates a top representation of an IC package in a tray after the application of L- shaped underfill elements, in accordance with an embodiment of the inventive subject matter.

FIG. 7 illustrates a top representation of an IC package 702 in a tray 704 after the application of L-shaped underfill elements 710, in accordance with an embodiment of the inventive subject matter.

IC package 702, which may be similar to, identical to, or different from IC package 602 illustrated in FIG. 6, is shown with its interconnects (e.g. solder balls 716) facing up. IC package 702 lies within tray 704. Tray 704 may have elevated detents or barriers 706 to retain IC package 702 within tray 704.

As seen in the example shown in FIG. 7, four L-shaped underfill elements 710 are located along or near the edges of IC package 602. The underfill elements 710 may be picked up and placed at the edges of IC package 702 by any suitable mechanism.

Although the L-shaped underfill elements 710 are illustrated in this example as having a particular geometry, they may have a different geometry in other embodiments. Also, each L-shaped underfill element 710 could have a different geometry from the other.

Although L-shaped underfill elements 710 are illustrated in this example as being positioned along the outside edge of IC package 702, in other embodiments they could be positioned at any suitable location between the solder balls 716 and the outside edge of IC package 702.

Figure 8:
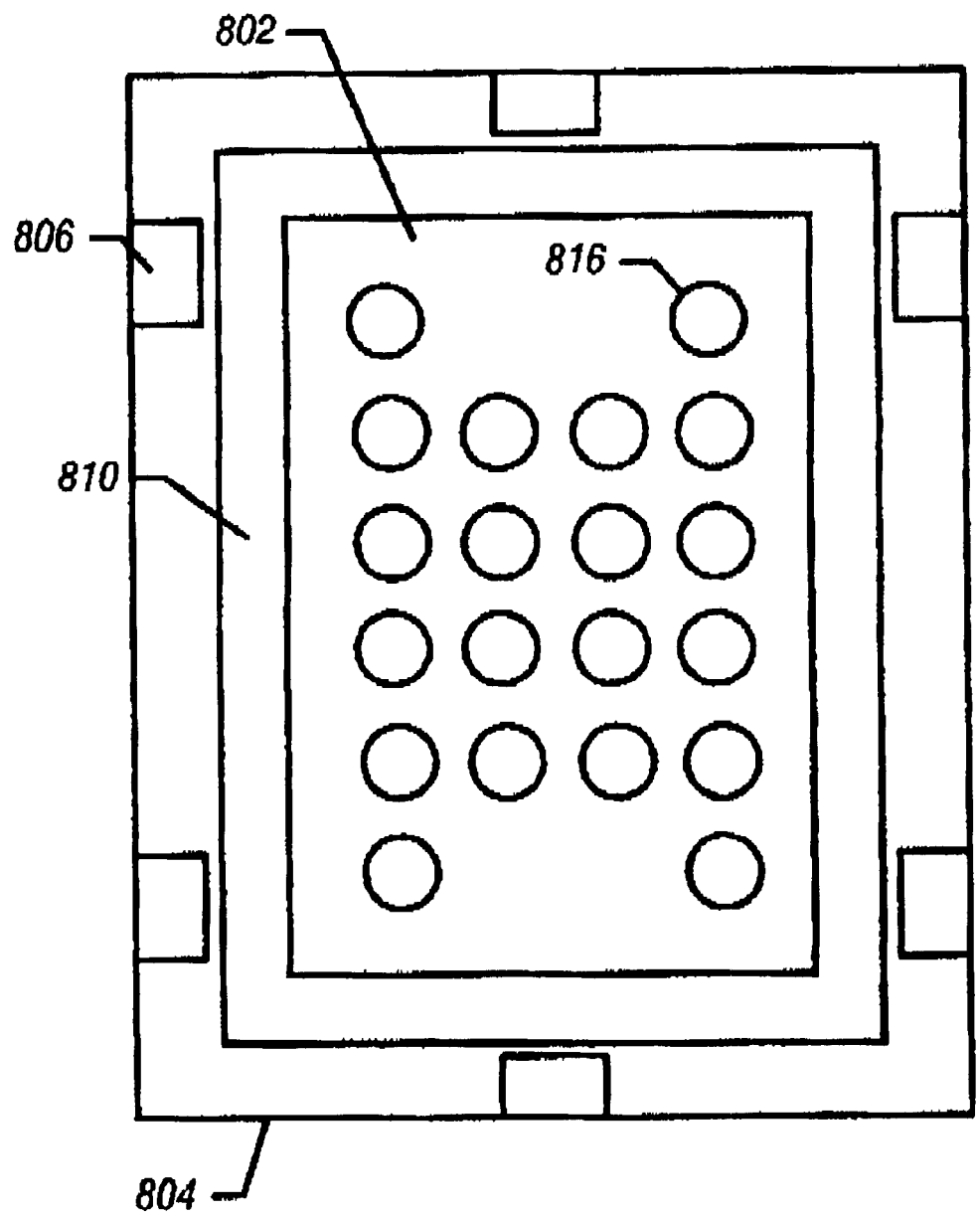
FIG. 8 illustrates a top representation of an IC package in a tray after the application of an O-shaped underfill element, in accordance with an embodiment of the inventive subject matter.

FIG. 8 illustrates a top representation of an IC package 802 in a tray 804 after the application of an O-shaped underfill element 810, in accordance with an embodiment of the inventive subject matter.

IC package 802, which may be similar to, identical to, or different from IC package 602 illustrated in FIG. 6, is shown with its interconnects (e.g. solder balls 816) facing up. IC package 802 lies within tray 804. Tray 804 may have elevated detents or barriers 806 to retain IC package 802 within tray 804.

As seen in the example shown in FIG. 8, a single, continuous O-shaped underfill element 810 is located along or near the edges of IC package 802. The underfill element 810 may be picked up and placed at the edges of IC package 802 by any suitable mechanism.

Although the O-shaped underfill element 810 is illustrated in this example as having a particular geometry, it may have a different geometry in other embodiments. As an example, underfill element 810 could have a gap in one side, so that in effect it appears C-shaped.

Although the O-shaped underfill element 810 is illustrated in this example as being positioned along the outside edge of IC package 802, in other embodiments it could be positioned at any suitable location between the solder balls 816 and the outside edge of IC package 802.

Although, in FIGS. 2–8, the object or component to which underfill is applied has been described as an IC package, the component could be any other type of component, such as a die or a circuit board. An example in which the component may be a singulated die will now be discussed regarding FIG. 9.

Figure 9:
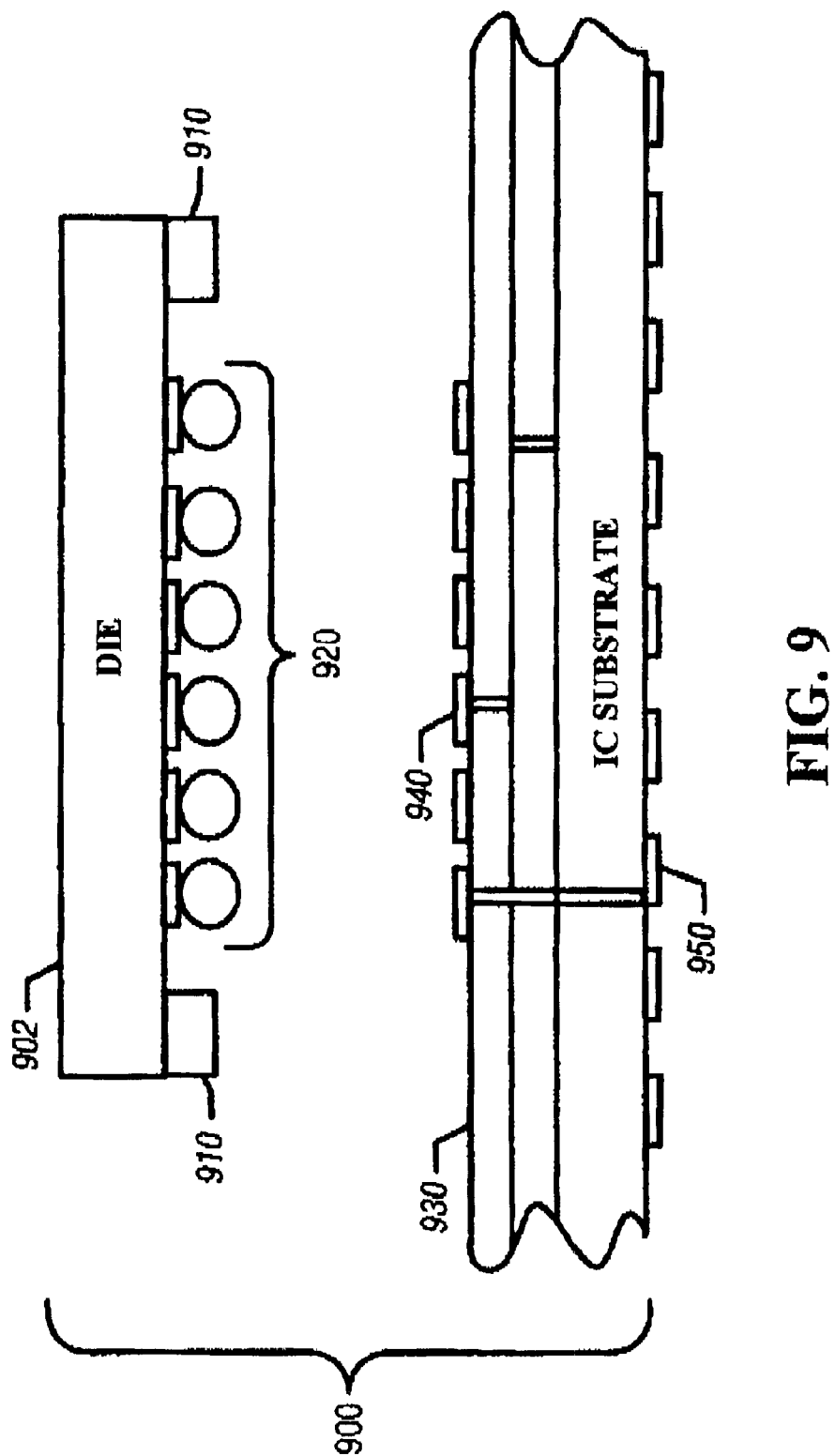
FIG. 9 illustrates a side representation of an IC package comprising a die having a pre- applied underfill, prior to chip attach to an IC substrate, in accordance with an embodiment of the inventive subject matter.

FIG. 9 illustrates a side representation of an IC package 900 comprising a die 902 having a pre-applied underfill 910, prior to chip attach to an IC substrate 930, in accordance with an embodiment of the inventive subject matter.

Die 902 may be of any type. In an embodiment, die 902 comprises a processor. Die 902 comprises any suitable interconnect 920, such as a plurality of solder balls. A pre-applied underfill 910 is located at the edges of die 902. Underfill 910 may have any suitable geometry, including any geometry described herein. Once underfill 910 has been applied to die 902, die 902 may be stored or transported to a location for subsequent manufacturing (e.g. test, reflow, etc.).

During a subsequent reflow operation, die 902 may be coupled to a package substrate, such as IC substrate 930, by coupling the interconnect 920 of die 902 to a corresponding set of lands 940 on IC substrate 930. IC substrate 930 may have a set of lands 950 on another surface to couple to an additional packaging element (not shown), such as a PCB.

Figure 10:
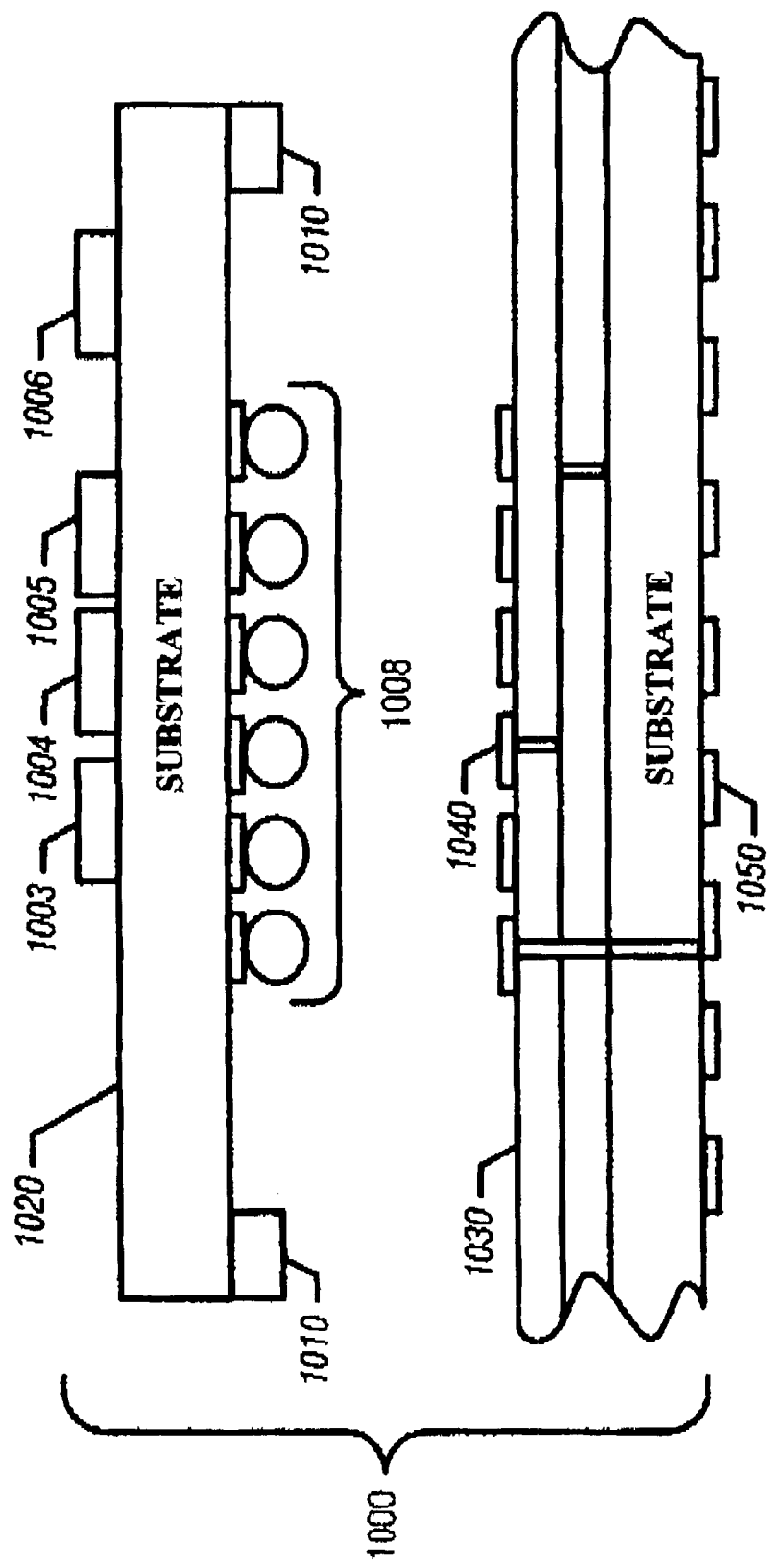
FIG. 10 illustrates a side representation of an electronic assembly comprising a first substrate having a pre-applied underfill, prior to attaching the first substrate to a second substrate, in accordance with an embodiment of the inventive subject matter.

FIG. 10 illustrates a side representation of an electronic assembly 1000 comprising a first substrate 1020 having a pre-applied underfill 1010, prior to attaching the first substrate 1020 to a second substrate 1030, in accordance with an embodiment of the inventive subject matter.

The first substrate 1020 may be of any type, including a PCB, such as a motherboard, a mezzanine board, or the like. The first substrate 1020 may be a one-layer board or a multi-layer board. The first substrate 1020 may comprise one or more electronic components of any type, such as IC's 1003–1006, on a surface thereof.

The second substrate 1030 may be of any type, including a PCB, such as a motherboard, a mezzanine board, or the like. The second substrate 1030 may be a one-layer board or a multi-layer board. The second substrate 1030 may comprise a plurality of lands 1040 on an upper surface, and it may include additional lands 1050 on its opposite surface for mating with additional packaging structure (not shown).

The first substrate 1020 may comprise any suitable interconnect 1008, such as a plurality of solder balls. A pre-applied underfill 1010 may be located at the edges of the first substrate 1020. Underfill 1010 may have any suitable geometry, including any geometry described herein. Once underfill 1010 has been applied to the first substrate 1020, the first substrate 1020 may be transported to a location for subsequent manufacturing (e.g. test, reflow, etc.) or stored.

During a subsequent reflow operation, the first substrate 1020 may be coupled to the second substrate 1030, by coupling the interconnect 1008 of the first substrate 1020 to lands 1040 on the second substrate 1030.

Figure 11:
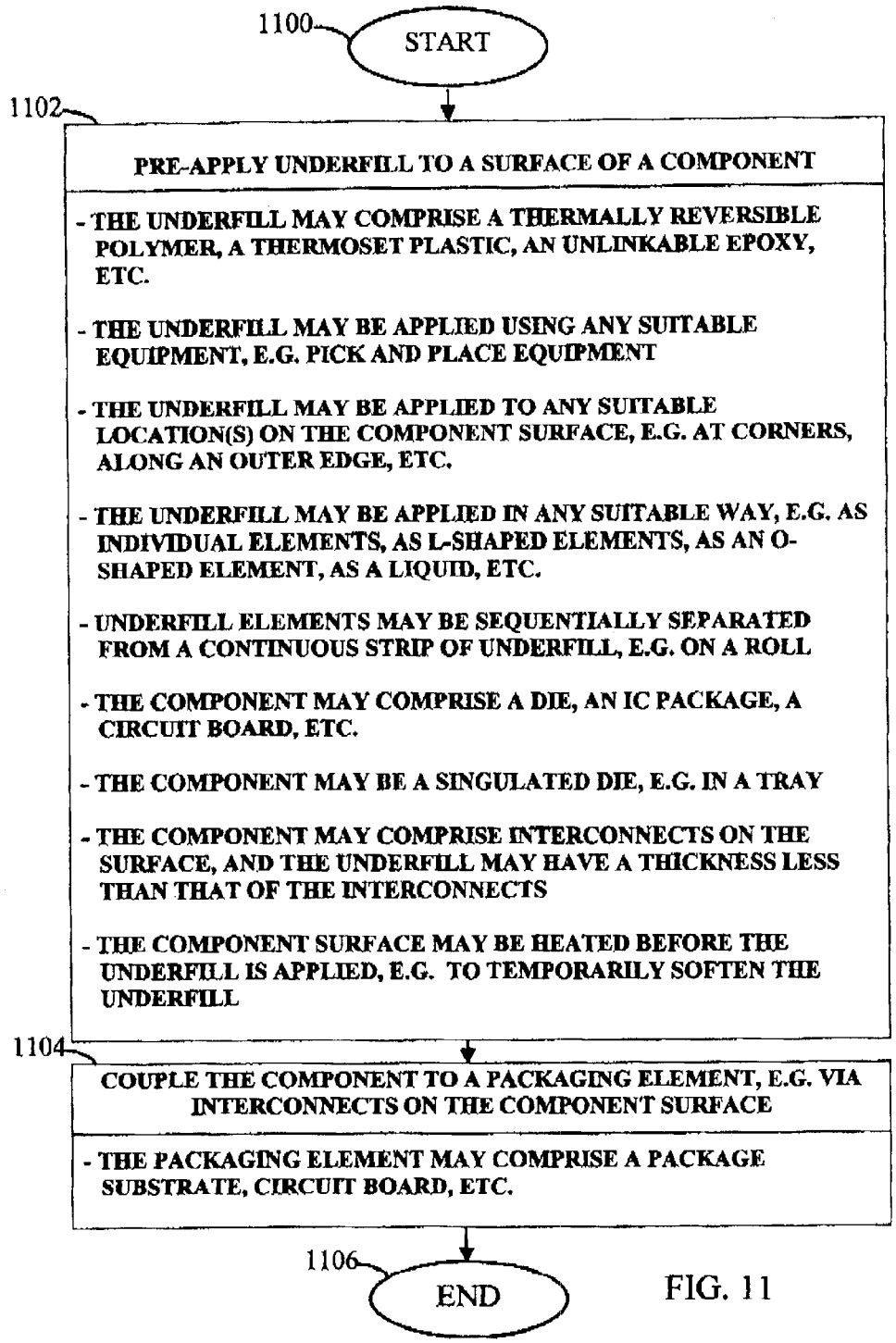
FIG. 11 is a flow diagram of several methods of pre-applying underfill to a component and subsequently coupling the component to a packaging element, in accordance with various embodiments of the inventive subject matter.

FIG. 11 is a flow diagram of several methods of pre-applying underfill to a component and subsequently coupling the component to a packaging element, in accordance with various embodiments of the inventive subject matter. The methods start in 1100.

In 1102, an underfill is pre-applied to a surface of a component. The underfill may comprise any suitable material. A polymeric adhesive may be used, such as a thermally reversible polymer. Alternatively, a thermoset plastic, an unlinkable epoxy, or the like may be used. Although thermally reversible materials have been described herein for certain embodiments, it is not essential to use such, and other materials may also be used. The underfill may be applied using any suitable equipment, such as pick-and-place equipment.

Still referring to 1102, the underfill may be applied to any suitable location(s) on the component surface, e.g. at corners, along an outer edge, between an outer edge and the component interconnect structure, etc. The underfill may be applied in any suitable way and in any suitable geometry, e.g. as individual elements (e.g. "dot" or "dashes"), as L-shaped elements, as an O-shaped element, as one or more C-shaped elements, or in elements of any other suitable geometrical shape, or in any combination of elements. In an embodiment, the underfill may be heated sufficiently to become liquid or semi-liquid, and it may be applied as a liquid or semi-liquid. In an embodiment, individual underfill elements may be sequentially separated from a supply of underfill material, e.g. a continuous strip of underfill material, such as a roll or reel of underfill material. In an embodiment, underfill elements may be pre-formed, e.g. by molding, cutting, punching, or the like, into a suitable shape.

Still referring to 1102, the component may be of any type, such as a die, an IC package, a circuit board, or any other type of packaging element. The component may be fabricated or procured. In an embodiment, the component may be a singulated die, that is, a die that has been separated from a semiconductor wafer. However, in other embodiments it may comprise any other type of electronic component, including active and passive devices, as well as discrete components such as resistors, capacitors, and the like. In some embodiments, the component may be a single IC package, a single PCB, etc. The singulated component may be transported and stored in a tray.

Still referring to 1102, the component may comprise interconnects on the surface to which the underfill is applied, and the underfill may have a thickness less than that of the interconnects, so that the underfill doesn't adhere to the upper surface of the substrate (or other type of packaging element to which the component is to be coupled) before one desires it to. In other embodiment, the underfill may have a thickness equal to or greater than that of the interconnects, e.g. if one should desire the underfill to contact and/or to adhere to the upper surface of the packaging element prior to a reflow operation. In an embodiment, the component surface may be suitably heated before the underfill is applied, e.g. to temporarily soften the underfill to promote adhesion of the underfill to the component surface.

In 1104, the component is coupled to a packaging element of any suitable type, considering the type of component. The component may be coupled to the packaging element via any suitable elements, e.g. via interconnects on the component surface such as solder balls or other connectors. The packaging element may comprise a package substrate (e.g. an IC package substrate), a circuit board, or the like. The methods end at 1106.

Figure 12:
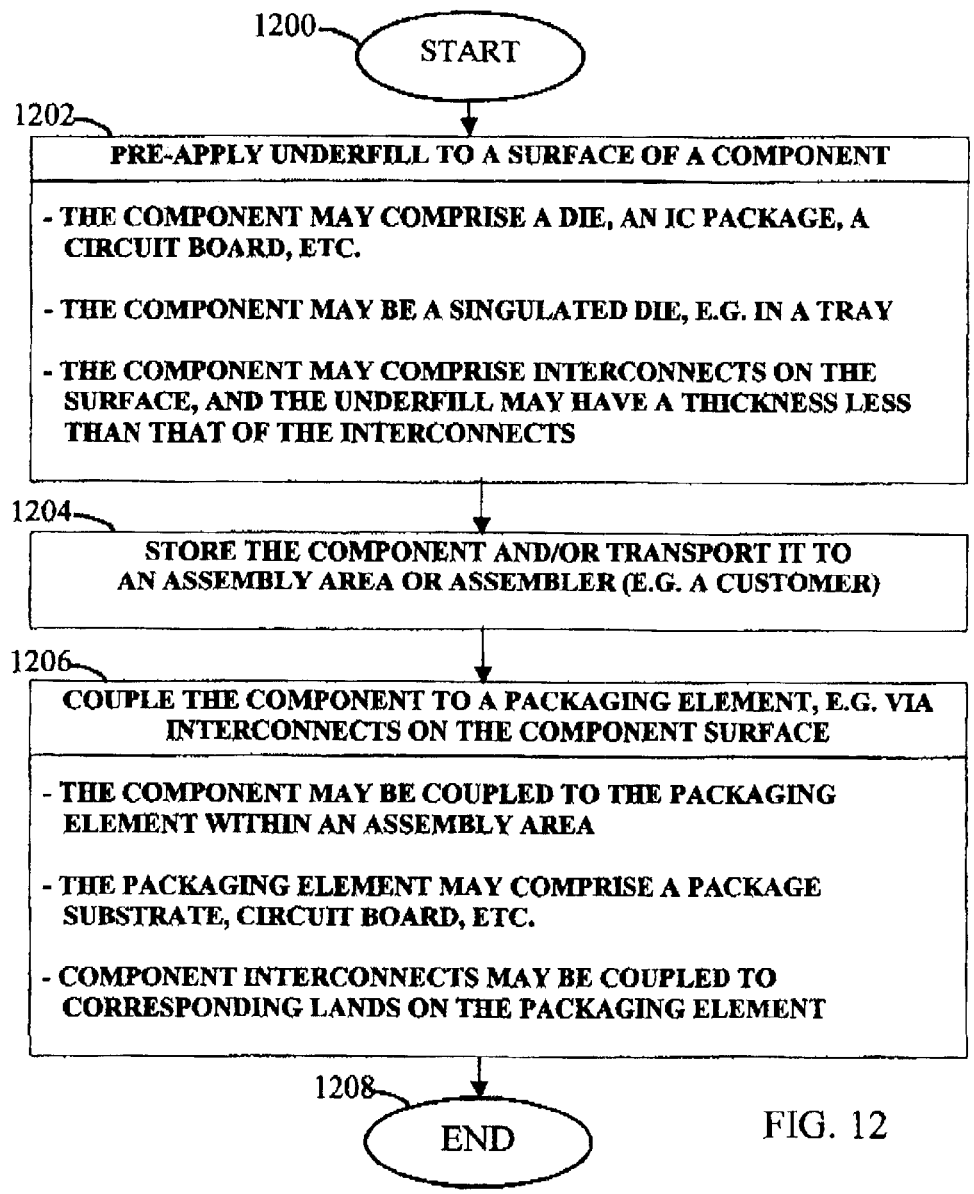
FIG. 12 is a flow diagram of several methods of fabricating an IC package, an electronic assembly, or an electronic system, by pre-applying underfill to a component, then storing and/or transporting the component, and subsequently coupling the component to a packaging element, in accordance with various embodiments of the inventive subject matter.

FIG. 12 is a flow diagram of several methods of fabricating an IC package, an electronic assembly, or an electronic system, by pre-applying underfill to a component, then storing and/or transporting the component, and subsequently coupling the component to a packaging element, in accordance with various embodiments of the inventive subject matter. The methods start in 1200.

In 1202, an underfill is pre-applied to a surface of a component. The component may comprise any type of packaging element, such as a die, an IC package, a circuit board, or the like. In an embodiment, the component may be a singulated die. The singulated component may be moved or stored in a tray. The component may comprise interconnects on the surface to which the underfill has been applied. In some embodiments, the underfill may have a thickness less than that of the interconnects; in other embodiments, the underfill thickness may be equal to or greater than that of the interconnects.

In 1204, the component may be stored with the pre-applied underfill in place. Alternatively, the component may be immediately coupled to a packaging element (refer to 1206, discussed below). As another alternative, the component may be moved to a different area, such as an assembly area, e.g. an area where the component is coupled to a packaging element. As a further alternative, the component may be shipped by the manufacturer to a customer that will couple the component to a packaging element. Having the ability to purchase a component with pre-applied underfill may enable the customer to reduce its manufacturing cost, because the customer may avoid having to purchase and apply underfill itself.

In 1206, the component is coupled to a packaging element. The component may be coupled to the packaging element in any suitable way, e.g. via interconnects on the component surface. The component may be coupled to the packaging element within an assembly area, e.g. an assembly area to which the component has been transported after underfill has been pre-applied, and possibly after storing the component for a period of time. The packaging element may be of any suitable type, considering the type of component. The packaging element may comprise a package substrate (e.g. an IC package substrate), a circuit board, or the like. In an embodiment, the component interconnects may be coupled to corresponding lands on the packaging element. The methods end at 1208.

The operations described above with respect to the methods illustrated in FIGS. 11 and 12 may be performed in a different order from those described herein. Although the flow diagrams of FIGS. 11 and 12 show an "End", they may be performed continuously if desired.

The above-described choice of components, underfill elements, materials, geometry, dimensions, fabrication operations, and assembly sequencing may all be varied by one of ordinary skill in the art to optimize the yield, reliability, and performance characteristics of the package.

The resulting package is flexible in terms of the orientation, size, number, order, and composition of its constituent elements. Various embodiments of the inventive subject matter may be implemented using various combinations of underfill and component technologies, choice of materials, and fabrication operations, to achieve the advantages of the inventive subject matter. The structure, including types of materials used, dimensions, layout, geometry, and so forth, of the package may be built in a wide variety of embodiments and fabrication methods, depending upon the requirements of the electronic assembly or electronic system of which it forms a part.

FIGS. 1–10 are merely representational and are not drawn to scale. Certain proportions thereof may be exaggerated, while others may be minimized. FIGS. 1–12 are intended to illustrate various embodiments of the inventive subject matter that can be understood and appropriately carried out by those of ordinary skill in the art.

The inventive subject matter provides for various methods of manufacture in which underfill is pre-applied to a component before the component is coupled to another packaging element. The inventive subject matter also provides for a package, an electronic assembly, and an electronic system fabricated by applying underfill to a component prior to coupling the component to a packaging element, such as a substrate. Other embodiments will be readily apparent to those of ordinary skill in the art after reading this disclosure.

Components having pre-applied underfill may save customers manufacturing costs and time, and such components may therefore be more commercially attractive than components lacking pre-applied underfill.

While certain operations have been described herein relative to "upper" and "lower" surfaces, it will be understood that these descriptors are relative, and that they would be reversed if the package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the inventive subject matter. Therefore, it is manifestly intended that embodiments of the inventive subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the inventive subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A method comprising:
   applying underfill to a surface of a component prior to coupling the component to a packaging element, wherein the component comprises interconnects on the surface and the underfill has a thickness less than that of the interconnects.

2. The method recited in claim 1 wherein, in applying, the underfill comprises a thermally reversible polymer.

3. The method recited in claim 1 wherein, in applying, the underfill comprises one of a thermoset plastic and an unlinkable epoxy.

4. The method recited in claim 1 and further comprising: coupling the interconnects to the packaging element.

5. The method recited in claim 1, wherein the packaging element comprises a substrate.

6. The method recited in claim 1 wherein, in applying, the component comprises a singulated die, and wherein the packaging element comprises a substrate.

7. The method recited in claim 1 wherein, in applying, the component comprises a singulated die in a tray.

8. The method recited in claim 7 wherein, in applying, the underfill is applied using pick-and-place equipment.

9. The method recited in claim 7 wherein, in applying, the underfill is applied at corners of the surface.

10. The method recited in claim 7 wherein, in applying, the surface comprises an outer edge, and wherein the underfill is applied along the outer edge.

11. The method recited in claim 1 wherein, in applying, the underfill is applied as a plurality of individual elements.

12. The method recited in claim 11 wherein, in applying, the individual elements are sequentially separated from a continuous strip of underfill.

13. The method recited in claim 1 wherein, in applying, the underfill is applied as a plurality of L-shaped elements.

14. The method recited in claim 1 wherein, in applying, the underfill is applied as an O-shaped element.

15. The method recited in claim 1 wherein, in applying, the underfill is heated and is applied as a liquid.

16. The method recited in claim 1 wherein, in applying, the component surface is heated before the underfill is applied.

17. The method recited in claim 1 wherein, in applying, the component is one of a die, an integrated circuit package, and a circuit board.

18. A method comprising:
applying underfill to a surface of a component, wherein the component comprises interconnects on the surface and the underfill has a thickness less than that of the interconnects;
storing the component; and
shipping the component to an assembler to couple the component to a packaging element.

19. The method recited in claim 18 wherein, in applying, the component comprises a singulated die, and wherein the packaging element comprises a substrate.

20. The method recited in claim 18 wherein, in applying, the component is one of a die, an integrated circuit package, and a circuit board.

21. A method comprising:
moving a component to an assembly area, the component comprising pre-applied underfill on a surface thereof, wherein the component comprises interconnects on the surface and the underfill has a thickness less than that of the interconnects; and
in the assembly area, coupling the component to a packaging element.

22. The method recited in claim 21 wherein, in coupling, the interconnects are connected to corresponding lands on a surface of the packaging element.

23. A package fabricated by:
applying underfill to a surface of a component prior to coupling the component to a packaging element, wherein the component comprises interconnects on the surface and the underfill has a thickness less than that of the interconnects; and
coupling the component to the packaging element.

24. The package recited in claim 23 wherein, in applying, the component comprises a singulated die.

25. The package recited in claim 23 wherein, in coupling, the interconnects are heated until they are connected with corresponding lands on a surface of the packaging element.

26. The package recited in claim 25 wherein, in applying, the underfill comprises a thermally reversible material, and wherein, in coupling, the underfill temporarily softens and adheres to the component surface and to the packaging element surface.

27. The package recited in claim 23 wherein, in applying, the component is one of a die, an integrated circuit package, and a circuit board.

28. An electronic assembly comprising an integrated circuit package fabricated by:
applying an adhesive to a surface of a singulated device prior to coupling the device to a substrate, wherein the device comprises pads on the surface, and wherein the adhesive has a thickness less than that of the pads; and
coupling the device pads to corresponding lands on the substrate.

29. The electronic assembly recited in claim 28 wherein, in coupling, the pads are heated until they are connected with corresponding lands on a surface of the substrate.

30. The electronic assembly recited in claim 29 wherein, in applying, the adhesive comprises a thermally reversible material, and wherein, in coupling, the adhesive temporarily softens and adheres to the device surface and to the substrate surface.

31. The electronic assembly recited in claim 28 wherein the device comprises a stack of at least two dice.

32. An electronic system comprising:
a bus coupling components in the electronic system;
a display coupled to the bus;
a processor coupled to the bus; and
external memory coupled to the bus and having at least one integrated circuit package fabricated by:
applying an adhesive to a surface of a singulated device prior to coupling the device to a substrate, wherein the device comprises interconnects on the surface and the adhesive has a thickness less than that of the interconnects; and
coupling interconnects on the device to corresponding lands on the substrate.

33. The electronic system recited in claim 32 wherein, in coupling, the interconnects are heated until they are connected with corresponding lands on a surface of the substrate.

34. The electronic system recited in claim 33 wherein, in applying, the adhesive comprises a thermally reversible material, and wherein, in coupling, the adhesive temporarily softens and adheres to the device surface and to the substrate surface.

35. The electronic system recited in claim 32 wherein the device comprises a stack of at least two memory dice.

* * * * *